(12) United States Patent
Little et al.

(10) Patent No.: US 6,640,194 B2
(45) Date of Patent: Oct. 28, 2003

(54) TIMING JITTER FREQUENCY DETECTOR FOR TIMING RECOVERY SYSTEMS

(75) Inventors: James M. Little, Sacramento, CA (US); Hiroshi Takatori, Sacramento, CA (US); Scott Chiu, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 183 days.

(21) Appl. No.: 10/001,649

(22) Filed: Oct. 31, 2001

(65) Prior Publication Data

US 2003/0083834 A1 May 1, 2003

(51) Int. Cl.[7] .............................................. G01R 13/00
(52) U.S. Cl. ........................... 702/74; 702/69; 702/89; 702/106; 324/76.52; 324/76.72; 375/226; 375/376; 331/18; 331/25; 327/156
(58) Field of Search ............................. 702/69, 74, 78, 702/70, 72, 89, 190; 324/76.39, 76.52, 76.72, 76.74, 76.47, 76.77; 375/226, 325, 376; 331/18, 25; 327/156

(56) References Cited

U.S. PATENT DOCUMENTS

| | | | | |
|---|---|---|---|---|
| 4,975,634 A | * | 12/1990 | Shohet | ..................... 324/76.77 |
| 6,211,742 B1 | | 4/2001 | Tan et al. | |
| 6,356,850 B1 | * | 3/2002 | Wilstrup et al. | ............... 702/69 |
| 6,528,982 B1 | * | 3/2003 | Yanagisawa et al. | ..... 324/76.77 |

FOREIGN PATENT DOCUMENTS

DE    199 43 790 A1    9/1999

OTHER PUBLICATIONS

"LCT360 T1/E1 LH/SH Transceiver," [on–line], [retrieved Jan. 17, 2002], retrieved from the Internet: <URL://http://www/intel.com/design/network/products/wan/tecarrier/lxt360.htm>.
"LXT360—Integrated T1/E1 LH/SH Transceiver for DS1/DSC–1 or PRI Applications," Order No. 249031–001, Jan. 2001, pp. 1–54.

* cited by examiner

Primary Examiner—Marc S. Hoff
Assistant Examiner—Andrew P Morris
(74) Attorney, Agent, or Firm—Pillsbury Winthrop LLP

(57) ABSTRACT

A frequency detector includes a slicer to receive and slice a phase error against a compare threshold value. The slicer generates a symbol based on the phase error sliced against the compare threshold value. A symbol counter is provided to increment a symbol count if the symbol generated is the same as a last symbol. A logic circuit compares the symbol count with a symbol count limit if the symbol is different from the last symbol. The logic circuit increments a high counter and clears a low counter if the symbol count is less than the symbol count limit. The logic circuit increments the low counter and clears the high counter if the symbol count is greater than the symbol count limit. A combinational logic circuit is provided to generate a high frequency jitter true signal or a high frequency jitter false signal based on at least one of the symbol count, the high counter, and the low counter.

25 Claims, 3 Drawing Sheets

TIMING JITTER FREQUENCY DETECTOR FOR TIMING RECOVERY SYSTEMS

BACKGROUND OF THE INVENTION

1. Field of the Invention

The present invention generally relates to a frequency detector for a timing recovery system. More particularly, the present invention relates to a frequency detector that adjusts the parameters of a timing recovery system based on the frequency of the incoming timing jitter, which optimizes the timing recovery system for both low frequency and high frequency timing jitter.

2. Discussion of the Related Art

Networking applications have become very popular in recent years, particularly in response to an explosion in the use and variety of networks employed in a vast array of computing environments. Accordingly, many advances have been made in the related technology in order to improve the quality of these networking systems. For example, fully integrated transceivers for T1 network channel service units (CSUs) and integrated services digital network (ISDN) primary rate interface applications are known in the art and are presently commercially available. These devices, such as the Intel LXT360 T1/E1 transceiver, are useful for networking applications, such as timing recovery in T1 network systems. However, there are obstacles that prevent such systems from providing better jitter tolerance—a desirable quality in communications networks and other networking applications. Such obstacles may include exceptionally large amplitude jitter, a wide variation in data density, large amounts of cable attenuation, and imperfect equalization.

Jitter is the general term used to describe the noise or uncertainty in the period of incoming data in a communications system. In an ideal system, bits arrive at time increments that are integer multiples of a bit repetition time. However, in a real-world system, data pulses arrive at times that deviate from these integer multiples. This deviation may cause errors in the transmission of data, particularly when the data is transmitted at high speeds. The deviation or variation may be in the amplitude, frequency, or phase of the data. Jitter may occur due to a number of causes, including inter-symbol interference, frequency differences between the transmitter and receiver clock, noise, and the non-ideal behavior of the receiver and transmitter clock generation circuits.

Jitter is a problem of particular import in digital communications systems. First, jitter causes the received signal to be sampled at a non-optimal sampling point. This occurrence reduces the signal-to-noise ratio at the receiver and thus limits the information rate. Second, in conventional systems, each receiver typically extracts its receive sampling clock from the incoming data signal. Jitter makes this task significantly more difficult. Third, in long-distance transmission systems, where multiple repeaters reside in a chain, jitter accumulates. That is, each receiver extracts a clock from the incoming bit stream, re-times the data, and re-transmits the data utilizing the recovered clock. Each subsequent receiver thus sees a progressively larger degree of input jitter.

Although current systems provide for jitter attenuation, these systems are not robust enough to handle wide variations between high-frequency jitter and low-frequency jitter. Moreover, current systems are not sensitive and stable enough to detect minor variations of high-frequency jitter and low-frequency jitter and may cause these systems to stall. In certain applications, such as T1 networks, where the incoming timing jitter could be quite large and could be over a wide frequency range, it is difficult to design, for example, a phase locked loop (PLL) that can simultaneously track large-amplitude low-frequency jitter and provide enough rejection of high frequency jitter.

Accordingly, there is a need for a timing recovery system having a frequency detector that tolerates large amplitude jitter with a wide frequency range, as well as having accurate and robust jitter detection.

DETAILED DESCRIPTION

Figure 1:
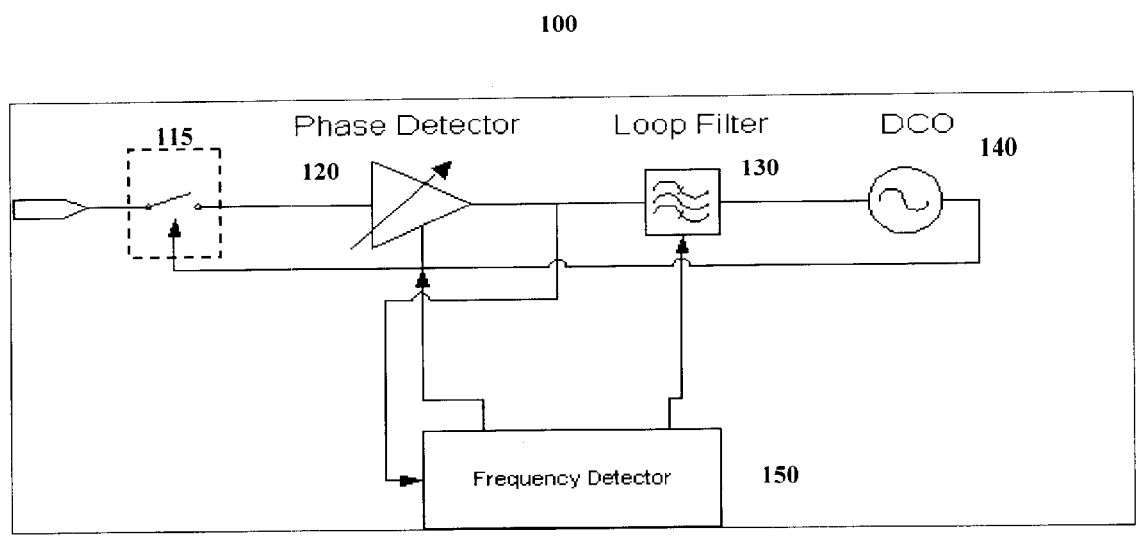
FIG. 1 illustrates a timing recovery system according to an embodiment of the present invention.

FIG. 1 illustrates a timing recovery system according to an embodiment of the present invention. The timing recovery system 100 of FIG. 1 includes a signal input 110 (see FIG. 2), a phase detector 120, a loop filter 130, an oscillator 140, and a frequency detector 150. The signal input 110 provides an input signal to the phase detector 120. The phase detector 120 receives the input signal from the signal input 10 and an output signal from the oscillator 140 via the sampler 115. The phase detector 120 outputs a difference signal (a phase error) indicative of the difference between the phase of the input signal and the output signal. In other words, the phase detector 120 estimates the difference between the optimal sampling phase and the actual received clock phase.

The loop filter 130, which may be a linear filter, receives the phase error from the phase detector 120. The loop filter 130 controls the bandwidth and frequency characteristics of the timing recovery system 100, preferably utilized in a PLL system. The loop filter 130 filters the phase error received from the phase detector 120 and outputs a control signal to be forwarded to the oscillator 140.

The oscillator 140, which may be a digitally controlled oscillator (DCO) as illustrated in FIG. 1, or a voltage controlled oscillator (VCO), receives the control signal from the loop filter 130 and creates a recovered clock as the output signal to provide to the phase detector 120 via the sampler 115. Basically, the timing recovery system 100 generates a sampling clock for the received signal that provides the best possible bit error rate (BER) in the presence of noise, inter-symbol interference (ISI), and timing jitter.

Figure 2:
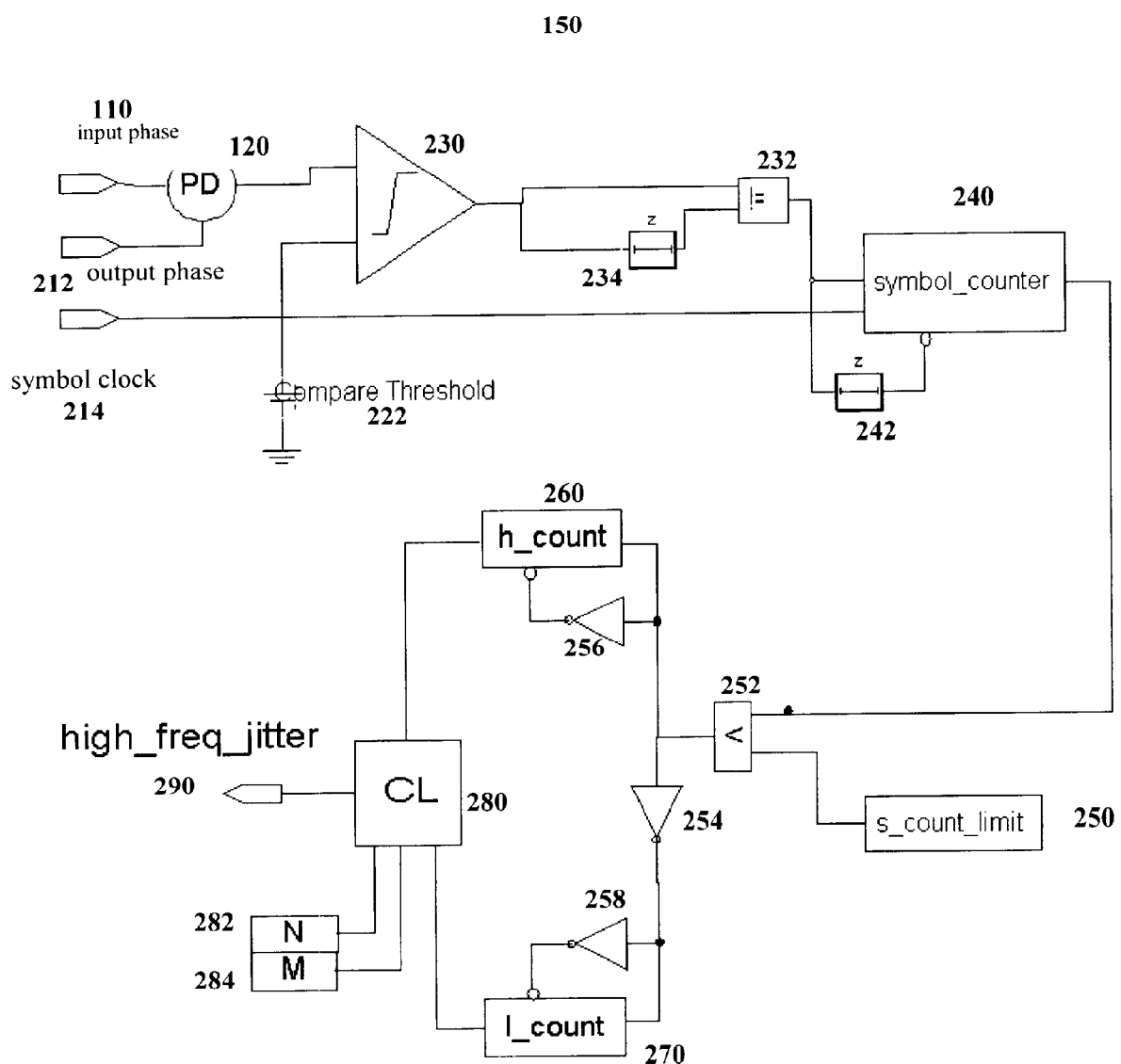
FIG. 2 illustrates a frequency detector utilized in the timing recovery system of FIG. 1 according to an embodiment of the present invention.

The frequency detector 150 also receives the phase error from the phase detector 120, and in turn determines whether there is high frequency jitter occurring in the timing recovery system 100. Although FIG. 1 illustrates a phase detector 120 providing the phase error to the frequency detector 150, any other suitable circuit that may produce a phase error may be utilized. Referring to FIG. 2, the frequency detector 150 includes a slicer (comparator) 230 that receives the phase error and slices/compares the phase error against a compare threshold value 222, which may be programmable. The output of the slicer 230 is preferably a symbol, which may be, for example, one of a value of −1, 0, or +1, corresponding to the slicing of the phase error against the compare threshold value 222. The use of a slicer 230 improves on the robustness of the timing recovery system 100. The slicer 230 ensures that the phase error is larger (in absolute value) than the compare threshold value 222 before it is passed downstream in the frequency detector 150. This configuration reduces the sensitivity of the frequency detector 150 to the small amplitude residual jitter (i.e., pattern dependent jitter) present at the output. The residual jitter as a form of noise to the frequency detector 150 if not filtered, could cause excessive "chatter" (i.e., rapid switching of output states) in the frequency detector output 290. A logic element 232 (which outputs a "true" value when its two inputs are not equal) and delay elements 234, 242 (e.g., delaying one symbol period) may be configured so that a symbol counter 240 increments a symbol count if the symbol generated is the same as the previously preceding (i.e., last) symbol. A symbol period or symbol clock is a clock operating at the frequency of the received symbols.

If the current symbol generated is not the same as the last symbol, then a logic circuit 252 compares the symbol count from the symbol counter 240 with a symbol count limit 250. If the comparison indicates that the symbol count is less than the symbol count limit 250, then in conjunction with the logical inverters with delay 254, 256, 258, a high counter 260 is incremented and a low counter is cleared (i.e., zeroed). However, if the comparison indicates that the symbol count is greater than the symbol count limit 250, then the low counter 270 is incremented and the high counter 260 is cleared. The jitter frequency is typically determined by the symbol frequency/symbol count limit 250. For example, in a T1 system, the symbol frequency is 1.544 MHz. If the symbol count limit 250 is set to 54, then a determination is being made as to whether the jitter frequency is above or below 28.593 KHz (1.544 MHz/54). The symbol count limit 250 may be selected depending on a number of factors, including, but not limited to: (1) the frequency response of the receive PLL; (2) the parameters that are going to be changed in the receive PLL; and (3) the expected characteristics of the incoming jitter.

A combinational logic circuit 280 analyzes the high counter value, the low counter value, and the symbol count in order to generate an output 290 of a high frequency jitter true signal or a high frequency jitter false signal. In order to introduce hysteresis and robustness in the timing recovery system 100, a compare value N 282 (which may be programmable) is utilized so that the state of the output 290 (i.e., a high frequency jitter true signal, or a high frequency jitter false signal) is not changed until the high counter or the low counter reaches the compare value N 282. The hysteresis prevents the timing recovery system 100 from rapidly switching output 290 states due to inadvertent events, such as noise. The compare value N 282 may be set to some number, such as three, and the combinational logic circuit 280 ensures that the state of the output 290 is changed only when the high counter or the low counter reaches the compare value N 282, in this instance, three. In other words, in the present example, only when three successive occurrences of a high frequency reading, based on the increment of the high counter three times in succession, will the combinational logic circuit 280 generate a high frequency jitter true signal as the output 290.

Alternatively, in the present example, only when three successive occurrences of a non-high frequency reading, based on the increment of the low counter three times in succession, will the combinational logic circuit 280 generate a high frequency jitter false signal as the output 290 A compare value M 284 (which may be programmable) may also be utilized as a "backup" to prevent stalls by clearing the output 290 (i.e., to indicate non-high frequency jitter) if the symbol count within the symbol counter 240 reaches a certain value. For example, if the compare value M 284 is set at 128, then, when the symbol count reaches 128, the combinational logic circuit 280 generates a high frequency jitter false signal. That is, if the symbol count is incrementing, especially 128 times in a row, then, there are no changes in the symbols for 128 symbol periods, thus indicating that there is no high frequency jitter occurring. This technique also protects against the case where both the jitter amplitude and the jitter frequency may be small. The more rapidly that the direction (symbol) of the phase error is changing, then the higher the frequency of the jitter.

As illustrated in FIG. 1, the output 290 of the frequency detector 150 may be provided to both the phase detector 120 and the loop filter 130. The phase detector 120 and the loop filter 130 may, based on the output 290 (i.e., a high frequency jitter true signal or a high frequency jitter false signal) received from the frequency detector 150, adjust the phase detector gain or the loop filter bandwidth in order to cope with the occurrence of low frequency jitter or high frequency jitter in the timing recovery system 100.

In short, the frequency detector 150 counts the number of symbol periods between symbol sign changes of the phase error. If the incoming jitter is sinusoidal, then the period of the incoming jitter is twice the number of symbol periods between the symbol sign changes. In FIG. 2, the symbol count limit 250 value defines the transition between low frequency jitter and high frequency jitter. The counters, high counter 260 and low counter 270, are utilized to count sequential high or low estimates, and the combinational logic circuit 280 is utilized to provide hysteresis and generate the output logic signal 290.

Figure 3:
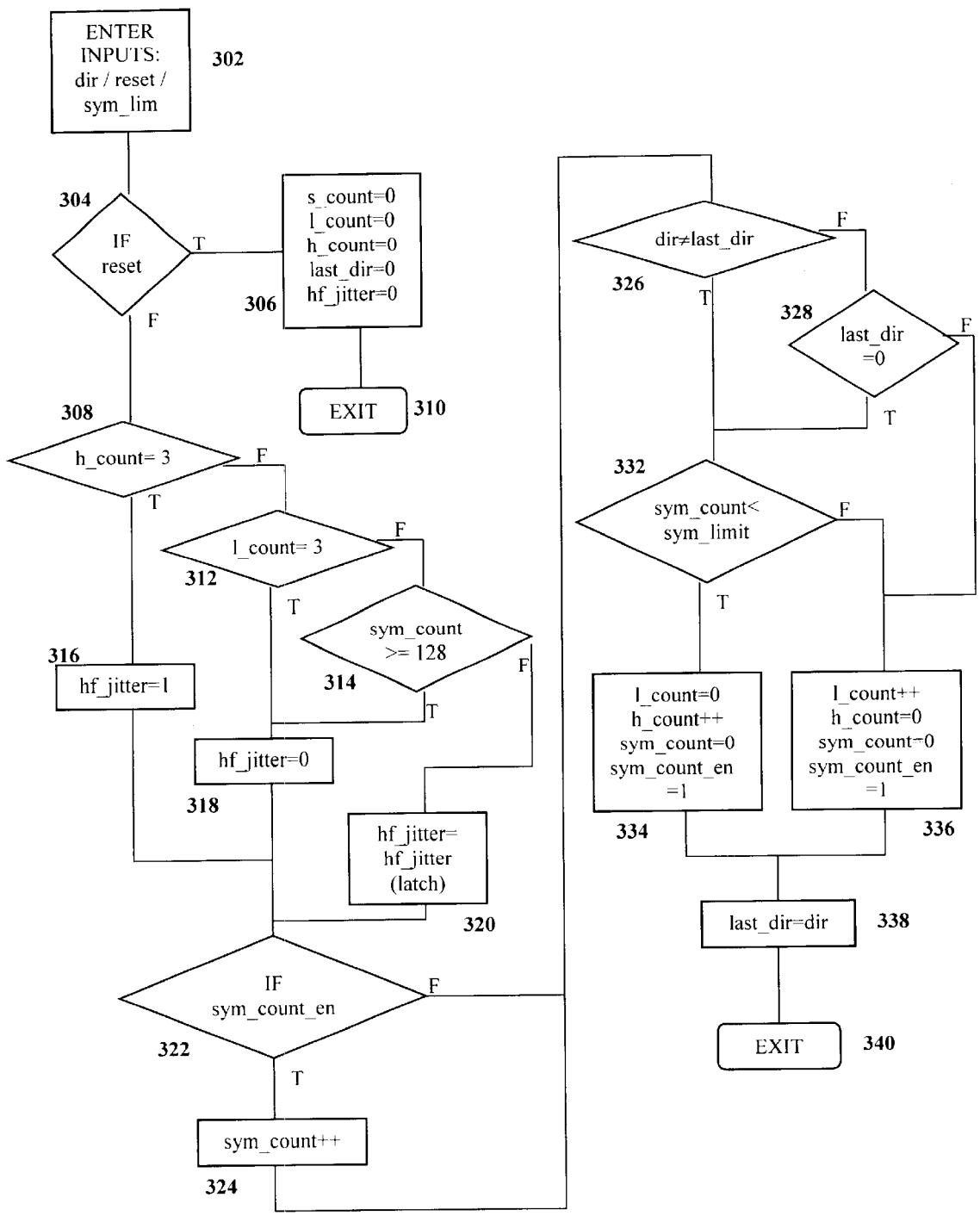
FIG. 3 illustrates a flowchart diagram of an operation of a frequency detector according to an embodiment of the present invention.

FIG. 3 illustrates a flowchart of an operation of a frequency detector according to an embodiment of the present invention. First, signals, including the symbol (dir) or sign of the phase error, a reset control signal (to reset the counters, parameters, etc.), and the symbol count limit 250 value may be entered 302 into the frequency detector 150. At step 304, if the reset signal is true, then all of the internal variables (e.g., the symbol count, low counter 270, high counter 260, last symbol ($last_{13}$ dir), and high frequency jitter true/false signal) are cleared 306 and the process is ended 310.

If the reset signal is false, then at step 308, it is determined whether the high counter 260 has reached the compare value N 282 (in the example, the value is set at three). If the high counter 260 has not reached the compare value N 282, then at step 312, it is determined whether the low counter 270 has reached the compare value N 282. If the low counter 270 has not reached the compare value N 282, then at step 314, it is determined whether the symbol count has reached or exceeded the compare value M 284 (in the example, the value is set at 128).

If it is determined 308 that the high counter 260 equals three, then the high frequency jitter true signal is set 316 as the output 290 from the frequency detector 150. If it is determined 312 that the low counter 270 equals three, then the high frequency jitter false signal is set 318 as the output 290 from the frequency detector 150. If it is determined 314 that the symbol count has reached or exceeded the compare value M 284, then the high frequency jitter false signal is set 318 as the output 290 from the frequency detector 150. If it is determined 314 that the symbol count has not reached the compare value M 284, then the high frequency jitter true/false signal is latched 320 to its last state.

Following the actions at steps 316, 318, and 320, it is determined 322 whether the symbol count enable signal has been toggled. If the symbol count enable signal has been toggled to true, then the symbol count in the symbol counter 240 is incremented 324. Following step 324, or if the symbol count enable signal was not toggled to true, then it is determined at step 326 whether the current symbol (dir) equals the last symbol (last_dir).

If the current symbol (dir) is not the same as the last symbol (last_dir), then it is determined 332 whether the symbol count is less than the symbol count limit 250. If the symbol count is less than the symbol count limit 250, then several variables may be set at step 334, including clearing the low counter 270 ($l_{13}$ count=0), incrementing the high counter 260 (h_count++), clearing the symbol count (sym_count=0) in the symbol counter 240, and toggling the symbol count enable signal to true (sym_count_en=1).

If the current symbol (dir) is the same as the last symbol (last_dir), then at step 328, it is determined whether the last symbol equaled zero. If it is determined 328 that the last symbol equaled zero, then the processing proceeds to step 332, as discussed above. If the last symbol does not equal zero, or at step 332 if the symbol count is not less than the symbol count limit 250, then several variables may be set at step 336, including incrementing the low counter 270 (l_count++), clearing the high counter (h_count=0), clearing the symbol count (sym_count=0), and toggling the symbol count enable signal to true (sym_count_en=1).

Following step 334 or 336, the last symbol (last_dir) is set equal to the current symbol (dir), in order to compare a subsequent symbol to be received by the frequency detector 150 and processing ends 340 until a new cycle is initiated.

In short, the operation is as follows: the output (phase error) of the phase detector 120 is sliced against the compare threshold value 222. The output of the slicer 230, the symbol, is compared to the last symbol. If the symbol and the last symbol are the same, then the symbol count is incremented and the process is repeated. If the symbol is different from the last symbol, then the symbol count is compared with the symbol count limit 250. If the symbol count is less than the symbol count limit 250, then the high counter 260 is incremented and the low counter 270 is cleared (i.e., zeroed). Otherwise, the low counter 270 is incremented and the high counter 260 is cleared.

Accordingly, the frequency detector 150 of the present invention provides accurate and robust detection of sinusoidal jitter with frequencies above and below some programmable threshold. The frequency detector 150 provides good performance even in the presence of significant amounts of pattern jitter. The frequency detector 150 is easy to implement and is easily configured for specific applications. The frequency detector 150 allows for simplification of the design of timing recovery systems 100 that need to tolerate large amplitude jitter with a wide frequency range. The parameters of a timing recovery system 100 may be easily adjusted based on the frequency of the incoming timing jitter, which allows the timing recovery system 100 to be optimized differently for low frequency and high frequency timing jitter.

While the description above refers to particular embodiments of the present invention, it will be understood that many modifications may be made without departing from the spirit thereof. The accompanying claims are intended to cover such modifications as would fall within the true scope and spirit of the present invention. The presently disclosed embodiments are therefore to be considered in all respects as illustrative and not restrictive, the scope of the invention being indicated by the appended claims, rather than the foregoing description, and all changes that come within the meaning and range of equivalency of the claims are therefore intended to be embraced therein.

What is claimed is:

1. A frequency detector, comprising:
   a slicer to receive and slice a phase error against a compare threshold value, and to generate a symbol based on the phase error sliced against the compare threshold value;
   a symbol counter to increment a symbol count if the symbol generated is same as a last symbol;
   a logic circuit to compare the symbol count with a symbol count limit if the symbol is different from the last symbol, to increment a high counter and clear a low counter if the symbol count is less than the symbol count limit, and to increment the low counter and clear the high counter if the symbol count is greater than the symbol count limit; and
   a combinational logic circuit to generate a high frequency jitter true signal or a high frequency jitter false signal based on at least one of the symbol count, the high counter, and the low counter.

2. The frequency detector according to claim 1, wherein the combinational logic circuit generates the high frequency jitter true signal if the high counter equals a predetermined value.

3. The frequency detector according to claim 1, wherein the combinational logic circuit generates the high frequency jitter false signal if the low counter equals a predetermined value.

4. The frequency detector according to claim 1, wherein the combinational logic circuit generates the high frequency jitter false signal if the symbol count equals a predetermined value.

5. The frequency detector according to claim 1, wherein the symbol generated by the slicer is selected from the group consisting of +1, 0, and −1.

6. A timing recovery system, comprising:
   a phase detector to receive an input phase signal and an output phase signal, wherein the phase detector outputs a phase error based on the input phase signal and the output phase signal;
   a loop filter to receive and filter the phase error from the phase detector and to output a control signal based on the filtered phase error;
   an oscillator to receive the control signal from the loop filter and to create a recovered clock as the output phase signal to provide to the phase detector; and
   a frequency detector having
      a slicer to receive and slice the phase error against a compare threshold value, and to generate a symbol based on the phase error sliced against the compare threshold value,
      a symbol counter to increment a symbol count if the symbol generated is same as a last symbol,
      a logic circuit to compare the symbol count with a symbol count limit if the symbol is different from the last symbol, to increment a high counter and clear a low counter if the symbol count is less than the symbol count limit, and to increment the low counter and clear the high counter if the symbol count is greater than the symbol count limit; and
      a combinational logic circuit to generate a high frequency jitter true signal or a high frequency jitter false signal for the phase detector and the loop filter based on at least one of the symbol count, the high counter, and the low counter.

7. The timing recovery system according to claim 6, wherein the combinational logic circuit generates the high frequency jitter true signal if the high counter equals a predetermined value.

8. The timing recovery system according to claim 6, wherein the combinational logic circuit generates the high frequency jitter false signal if the low counter equals a predetermined value.

9. The timing recovery system according to claim 6, wherein the combinational logic circuit generates the high frequency jitter false signal if the symbol count equals a predetermined value.

10. The timing recovery system according to claim 6, wherein the loop filter adjusts a loop filter bandwidth based on the high frequency jitter true signal or the high frequency jitter false signal.

11. The timing recovery system according to claim 6, wherein the symbol generated by the slicer is selected from the group consisting of +1, 0, and −1.

12. The timing recovery system according to claim 6, wherein the oscillator is a digitally controlled oscillator (DCO).

13. The timing recovery system according to claim 6, wherein the oscillator is a voltage controlled oscillator (VCO).

14. The timing recovery system according to claim 6, wherein the phase detector adjusts a phase detector gain based on the high frequency jitter true signal or the high frequency jitter false signal.

15. The timing recovery system according to claim 6, wherein the oscillator adjusts an oscillator gain based on the high frequency jitter true signal or the high frequency jitter false signal.

16. A method of operating a frequency detector, comprising:

slicing a phase error against a compare threshold value;

generating a symbol based on the phase error sliced against the compare threshold value;

incrementing a symbol count if the symbol generated is same as a last symbol;

comparing the symbol count with a symbol count limit if the symbol is different from the last symbol;

incrementing a high counter and clearing a low counter if the symbol count is less than the symbol count limit after comparing the symbol count with the symbol count limit;

incrementing the low counter and clearing the high counter if the symbol count is greater than the symbol count limit after comparing the symbol count with the symbol count limit; and generating a high frequency true signal or a high frequency jitter false signal based on at least one of the symbol count, the high counter, and the low counter.

17. The method according to claim 16, further including generating the high frequency jitter true signal if the high counter equals a predetermined value.

18. The method according to claim 16, further including generating the high frequency jitter false signal if the low counter equals a predetermined value.

19. The method according to claim 16, further including generating the high frequency jitter false signal if the symbol count equals a predetermined value.

20. The method according to claim 16, wherein the symbol generated is selected from the group consisting of +1, 0, and −1.

21. A frequency detector, comprising:

a machine-readable storage medium; and machine-readable program code, stored on the machine-readable storage medium, having instructions to slice a phase error against a compare threshold value;

generate a symbol based on the phase error sliced against the compare threshold value;

increment a symbol count if the symbol generated is same as a last symbol;

compare the symbol count with a symbol count limit if the symbol is different from the last symbol;

increment a high counter and clear a low counter if the symbol count is less than the symbol count limit after the symbol count is compared with the symbol count limit;

increment the low counter and clear the high counter if the symbol count is greater than the symbol count limit after the symbol count is compared with the symbol count limit; and generate a high frequency true signal or a high frequency jitter false signal based on at least one of the symbol count, the high counter, and the low counter.

22. The frequency detector according to claim 21, wherein the machine-readable program code further includes instructions to generate the high frequency jitter true signal if the high counter equals a predetermined value.

23. The frequency detector according to claim 21, wherein the machine-readable program code further includes instructions to generate the high frequency jitter false signal if the low counter equals a predetermined value.

24. The frequency detector according to claim 21, wherein the machine-readable program code further includes instructions to generate the high frequency jitter false signal if the symbol count equals a predetermined value.

25. The frequency detector according to claim 21, wherein the symbol generated is selected from the group consisting of +1, 0, and −1.

* * * * *